United States Patent
Verdon-Akzam

(10) Patent No.: US 11,526,797 B2
(45) Date of Patent: Dec. 13, 2022

(54) QUANTUM REPEATER FROM QUANTUM ANALOG-DIGITAL INTERCONVERTER

(71) Applicant: X Development LLC, Mountain View, CA (US)

(72) Inventor: Guillaume Verdon-Akzam, Waterloo (CA)

(73) Assignee: X Development LLC, Mountain View, CA (US)

(*) Notice: Subject to any disclaimer, the term of this patent is extended or adjusted under 35 U.S.C. 154(b) by 143 days.

(21) Appl. No.: 17/063,492

(22) Filed: Oct. 5, 2020

(65) Prior Publication Data

US 2021/0103847 A1    Apr. 8, 2021

Related U.S. Application Data

(60) Provisional application No. 62/911,132, filed on Oct. 4, 2019.

(51) Int. Cl.
*G06F 15/00* (2006.01)
*G06N 10/00* (2022.01)
(Continued)

(52) U.S. Cl.
CPC ............. *G06N 10/00* (2019.01); *H03M 1/12* (2013.01); *H03M 1/66* (2013.01); *H04B 10/70* (2013.01); *G06F 17/14* (2013.01); *H03M 1/1245* (2013.01)

(58) Field of Classification Search
CPC .......... G06N 10/00; H03M 1/12; H03M 1/66; H03M 1/1245; H04B 10/70; G06F 17/14
See application file for complete search history.

(56) References Cited

U.S. PATENT DOCUMENTS

| | | | |
|---|---|---|---|
| 11,308,415 B2* | 4/2022 | Verdon-Akzam | ....... G06F 17/14 |
| 2017/0286858 A1 | 10/2017 | La Cour et al. | |
| 2019/0049495 A1 | 2/2019 | Ofek et al. | |

FOREIGN PATENT DOCUMENTS

WO    WO 2019/156760    8/2019

OTHER PUBLICATIONS

Fluhmann et al., "Encoding a qubit in a trapped-ion mechanical oscillator," Nature, Feb. 2019, 566:513-517.
(Continued)

*Primary Examiner* — Joseph J Lauture
(74) *Attorney, Agent, or Firm* — Fish & Richardson P.C.

(57) ABSTRACT

Quantum repeater systems and apparatus for quantum communication. In one aspect, a system includes a quantum signal receiver configured to receive a quantum field signal; a quantum signal converter configured to: sample quantum analog signals from a quantum field signal received by the quantum signal receiver; encode sampled quantum analog signals as corresponding digital quantum information in one or more qudits, comprising applying a hybrid analog-digital encoding operation to each quantum analog signal and a qudit in an initial state; decode digital quantum information stored in the one or more qudits as a recovered quantum field signal, comprising applying a hybrid digital-analog decoding operation to each qudit and a quantum analog register in an initial state; a quantum memory comprising qudits and configured to store digital quantum information encoded by the quantum signal converter; and a quantum signal transmitter configured to transmit the recovered quantum field signal.

20 Claims, 8 Drawing Sheets

(51) Int. Cl.
 H03M 1/12 (2006.01)
 H03M 1/66 (2006.01)
 H04B 10/70 (2013.01)
 G06F 17/14 (2006.01)

(56) References Cited

OTHER PUBLICATIONS

Mitarai et al., "Quantum Analog-Digital Conversion," CoRR, May 2018, arxiv.org/abs/1805.11250, 9 pages.
PCT International Search Report and Written Opinion in International Appln. No. PCT/US202005430I, dated Feb. 16, 2021, 16 pages.
PCT International Search Report and Written Opinion in International Appln. No. PCT/US2020054305, dated Feb. 9, 2021, 27 pages.
Shi et al., "Fault-tolerant preparation of approximate GKP states," New J. Phys., 2019, 21:093007.
Terhal et al., "Encoding a qubit into a cavity mode in circuit QED using phase estimation," Physical Review, Jan. 2016, 93:012315.
Verdon et al., "A Universal Training Algorithm for Quantum Deep Learning," CoRR, Jun. 2018, arxiv.org/abs/1806.09729, 83 pages.
Verdon-Akzam, "Probing Quantum Fields: Measurements and Quantum Energy Teleportation," Thesis for the degree of Master of Mathematics in Applied Mathematics (Quantum Information), University of Waterloo, Ontario Canada, 2017, 181 pages.
U.S. Appl. No. 17/063,595, filed Oct. 5, 2020, Guillaume Verdon-Akzam.
U.S. Appl. No. 17/063,660, filed Oct. 5, 2020, Guillaume Verdon-Akzam.
Bergmann et al., "Hybrid quantum repeater for qudits," Physical Review A, Mar. 2019, 99(3):032349.
PCT International Search Report and Written Opinion in International Appln. No. PCT/US20/54309, dated Feb. 1, 2021, 8 pages.
Forsch et al., "Microwave-to-optics conversion using a mechanical oscillator in its quantum ground state," Nature Physics, Oct. 2019, 16:69-74.
Gottesman et al., "Encoding a qubit in an oscillator," CoRR, Aug. 2000, arxiv.org/abs/quant-ph/0008040, 22 pages.
Macridin et al., "Digital quantum computation of fermion-boson interacting systems," CoRR, May 2018, arxiv.org/abs/1805.09928, 20 pages.
Rueda et al., "Efficient microwave to optical photon conversion; an electro-optical realization," Optica, Jun. 2016, 3(6):597-604.

* cited by examiner

QUANTUM REPEATER FROM QUANTUM ANALOG-DIGITAL INTERCONVERTER

CROSS-REFERENCE TO RELATED APPLICATION

This application claims the benefit of the filing date of U.S. Provisional Application No. 62/911,132, filed on Oct. 4, 2019. The contents of U.S. Application No. 62/911,132 is incorporated herein by reference in their entirety.

TECHNICAL FIELD

This specification relates to quantum computing and quantum communication.

BACKGROUND

Quantum information includes any type of information carried by a quantum system. Quantum information can include quantum digital information and quantum analog information.

The most basic unit of quantum digital information is the qubit. A qubit is a two-level quantum-mechanical system. In a classical system, a bit would have to be in one level or the other. However, quantum mechanics allows a qubit to be in a coherent superposition of both levels, a property which is fundamental to quantum mechanics and quantum computing.

Quantum analog information is carried by continuous-variable quantum systems, e.g., quantum fields.

SUMMARY

This specification describes a quantum repeater system for quantum communication.

In general, one innovative aspect of the subject matter described in this specification can be embodied in a quantum repeater system for quantum communication, the system comprising: a quantum signal receiver configured to receive a quantum field signal; a quantum signal converter connected to the quantum signal receiver, wherein the quantum signal converter is configured to: sample one or more quantum analog signals from the quantum field signal received by the quantum signal receiver; encode sampled quantum analog signals as corresponding digital quantum information in one or more qudits, comprising, for each sampled quantum analog signal, applying a hybrid analog-digital encoding operation to the quantum analog signal and a qudit in an initial state; decode digital quantum information stored in the one or more qudits as a recovered quantum field signal, comprising, for each of the one or more qudits, applying a hybrid digital-analog decoding operation to the qudit and a quantum analog register in an initial state; a quantum memory connected to the quantum signal converter, wherein the quantum memory comprises one or more qudits and is configured to store digital quantum information encoded by the quantum signal converter; and a quantum signal transmitter connected to the quantum signal converter, wherein the quantum signal transmitter is configured to transmit the recovered quantum field signal.

The foregoing and other implementations can each optionally include one or more of the following features, alone or in combination. In some implementations the received quantum field signal comprises a Gottesman, Kitaev and Preskill (GKP) state; the one or more quantum analog signals sampled by the quantum signal converter comprise one or more GKP state samples; and the recovered quantum field signal comprises a recovered GKP state.

In some implementations the quantum memory is further configured to perform quantum error correction operations on digital quantum information stored in the quantum memory.

In some implementations the quantum error correction operations comprise syndrome measurements, classical decoder operations and quantum error correcting feedback operations.

In some implementations the quantum signal converter is further configured to decode error corrected digital quantum information stored in the one or more qudits as a recovered quantum field signal.

In some implementations the system further comprises multiple quantum signal receivers, quantum signal converters, quantum memories, and quantum signal transmitters connected to form a quantum network.

In some implementations the hybrid digital-analog encoding operation and the hybrid analog-digital decoding operation are based on a swap operation comprising three adder operations.

In some implementations the hybrid digital-analog encoding operation and the hybrid analog-digital decoding operation comprise: a first unitary transformation comprising a canonical field momentum operator and a qudit field operator; multiple Fourier transformations; and a second unitary transformation comprising a canonical field position operator and the qudit field operator.

In some implementations applying the hybrid analog-digital encoding operation to the quantum analog signal and a qudit in an initial state comprises: applying the first unitary transformation to the quantum analog signal and the initial state of the qudit to obtain a first modified quantum analog signal and a first evolved state of the qudit sequentially applying two Fourier transformations to the first modified quantum analog signal to obtain a second modified quantum analog signal; applying a Fourier transformation to the first evolved state of the qudit to obtain a second evolved state of the qudit; applying the second unitary transformation to the second modified quantum analog signal and the second evolved state of the qudit to obtain a third modified quantum analog signal and a third evolved state of the qudit; applying a Fourier transformation to the third evolved state of the qudit to obtain a fourth evolved state of the qudit; and applying the first unitary transformation to the third modified quantum analog signal and the fourth evolved state of the qudit to obtain a fifth evolved state of the qudit, wherein providing the qudit in the evolved state as a quantum digital encoding of the received quantum analog signal comprises providing the qudit in the fifth evolved state as a quantum digital encoding of the received quantum analog signal.

In some implementations applying the hybrid digital-analog decoding operation to the qudit and a quantum analog register in an initial state comprises: sequentially applying two Fourier transformations to the quantum analog register in the initial state to obtain a first modified state of the quantum analog register; applying a first unitary transformation to the first modified state of the quantum analog register and the fourth qudit to obtain a second modified state of the quantum analog register and a first evolved state of the fourth qudit, wherein the first unitary transformation comprises a canonical field momentum operator and a qudit field operator; applying a Fourier transformation to the first evolved state of the fourth qudit to obtain a second evolved state of the fourth qudit; applying a second unitary transformation to the second modified state of the quantum analog register and the second evolved state of the fourth qudit to obtain a third modified state of the quantum analog register and a third evolved state of the fourth qudit, wherein the second unitary transformation comprises a canonical field position operator and the qudit field operator; applying a Fourier transformation to the third evolved state of the fourth qudit to obtain a fourth evolved state of the fourth qudit; sequentially applying two Fourier transformations to the third modified state of the quantum analog register to obtain a fourth modified state of the quantum analog register; and applying the first unitary transformation to the fourth modified state of the quantum analog register and the fourth evolved state of the fourth qudit to obtain a fifth modified state of the quantum analog register, wherein providing the modified state of the quantum analog register as a quantum analog encoding of the quantum digital information comprises providing the fifth modified state of the quantum analog register as the quantum analog encoding of the quantum digital information.

In general, another one innovative aspect of the subject matter described in this specification can be embodied in a method for repeating a quantum field signal, the method comprising: receiving a quantum field signal; sampling one or more quantum analog signals from the received quantum field signal; for each sampled quantum analog signal: encoding the quantum analog signal as corresponding digital quantum information, comprising applying a hybrid analog-digital encoding operation to the quantum analog signal and a qudit in an initial state; and storing the corresponding digital quantum information in the qudit; generating a recovered quantum field signal, comprising: for each qudit storing corresponding digital quantum information, decoding the quantum digital information by applying a hybrid digital-analog decoding operation to the qudit and a quantum analog register in an initial state; and combining the decoded quantum digital information; and transmitting the recovered quantum field signal.

Other embodiments of this aspect include corresponding classical and quantum computer and communication systems, apparatus, and computer programs recorded on one or more computer storage devices, each configured to perform the actions of the methods. A system of one or more classical and quantum computers and/or communication systems can be configured to perform particular operations or actions by virtue of software, firmware, hardware, or any combination thereof installed on the system that in operation may cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations the received quantum field signal comprises a Gottesman, Kitaev and Preskill (GKP) state; the one or more quantum analog signals sampled by the quantum signal converter comprise one or more GKP state samples; and the recovered quantum field signal comprises a recovered GKP state.

In some implementations storing the corresponding digital quantum information further comprises performing one or more rounds of quantum error correction operations on digital quantum information stored in the quantum memory.

In some implementations the quantum error correction operations comprise syndrome measurements, classical decoder operations and quantum error correcting feedback operations.

In some implementations generating the recovered quantum field signal comprises, for each qudit storing corresponding error corrected digital quantum information, decoding the error corrected quantum digital information by applying a hybrid digital-analog decoding operation to the qudit storing error corrected digital quantum information and a quantum analog register in an initial state.

In some implementations the hybrid digital-analog encoding operation and the hybrid analog-digital decoding operation are based on a swap operation comprising three adder operations.

In some implementations the swap operation comprises: a first adder operation applied to a first signal and a second signal; two sequential Fourier transformations applied to the second signal; a second adder operation applied to the first signal and the second signal; two sequential Fourier transformations applied to the first signal; a third adder operation applied to the first signal and the second signal; and two sequential Fourier transformations applied to the second signal.

In some implementations the hybrid digital-analog encoding operation and the hybrid analog-digital decoding operation comprise: a first unitary transformation comprising a canonical field momentum operator and a qudit field operator; multiple Fourier transformations; and a second unitary transformation comprising a canonical field position operator and the qudit field operator.

In some implementations applying the hybrid analog-digital encoding operation to the quantum analog signal and a qudit in an initial state comprises: applying the first unitary transformation to the quantum analog signal and the initial state of the qudit to obtain a first modified quantum analog signal and a first evolved state of the qudit; sequentially applying two Fourier transformations to the first modified quantum analog signal to obtain a second modified quantum analog signal; applying a Fourier transformation to the first evolved state of the qudit to obtain a second evolved state of the qudit; applying the second unitary transformation to the second modified quantum analog signal and the second evolved state of the qudit to obtain a third modified quantum analog signal and a third evolved state of the qudit; applying a Fourier transformation to the third evolved state of the qudit to obtain a fourth evolved state of the qudit; and applying the first unitary transformation to the third modified quantum analog signal and the fourth evolved state of the qudit to obtain a fifth evolved state of the qudit, wherein providing the qudit in the evolved state as a quantum digital encoding of the received quantum analog signal comprises providing the qudit in the fifth evolved state as a quantum digital encoding of the received quantum analog signal.

In some implementations applying the hybrid digital-analog decoding operation to the qudit and a quantum analog register in an initial state comprises: sequentially applying two Fourier transformations to the quantum analog register in the initial state to obtain a first modified state of the quantum analog register; applying a first unitary transformation to the first modified state of the quantum analog register and the fourth qudit to obtain a second modified state of the quantum analog register and a first evolved state of the fourth qudit, wherein the first unitary transformation comprises a canonical field momentum operator and a qudit field operator; applying a Fourier transformation to the first evolved state of the fourth qudit to obtain a second evolved state of the fourth qudit; applying a second unitary transformation to the second modified state of the quantum analog register and the second evolved state of the fourth qudit to obtain a third modified state of the quantum analog register and a third evolved state of the fourth qudit, wherein the second unitary transformation comprises a canonical field position operator and the qudit field operator; applying a Fourier transformation to the third evolved state of the fourth qudit to obtain a fourth evolved state of the fourth qudit; sequentially applying two Fourier transformations to the third modified state of the quantum analog register to obtain a fourth modified state of the quantum analog register; and applying the first unitary transformation to the fourth modified state of the quantum analog register and the fourth evolved state of the fourth qudit to obtain a fifth modified state of the quantum analog register, wherein providing the modified state of the quantum analog register as a quantum analog encoding of the quantum digital information comprises providing the fifth modified state of the quantum analog register as the quantum analog encoding of the quantum digital information.

The details of one or more implementations of the subject matter of this specification are set forth in the accompanying drawings and the description below. Other features, aspects, and advantages of the subject matter will become apparent from the description, the drawings, and the claims.

DETAILED DESCRIPTION

This specification describes a quantum repeater system for receiving and transmitting quantum field signals. The quantum repeater system uses a quantum analog-digital interconverter that implements a hybrid analog-digital conversion operation to encode received quantum field signals as digital quantum information. The digital quantum information is stored in memory and can undergo one or more rounds of quantum error correction. The quantum analog-digital interconverter can further implement a hybrid digital-analog conversion operation to decode stored digital quantum information as a recovered quantum field signal. In some cases the quantum analog-digital interconverter can encode, error correct, and decode Gottesman-Kitaev-Preskill (GKP) quantum states.

Figure 1:
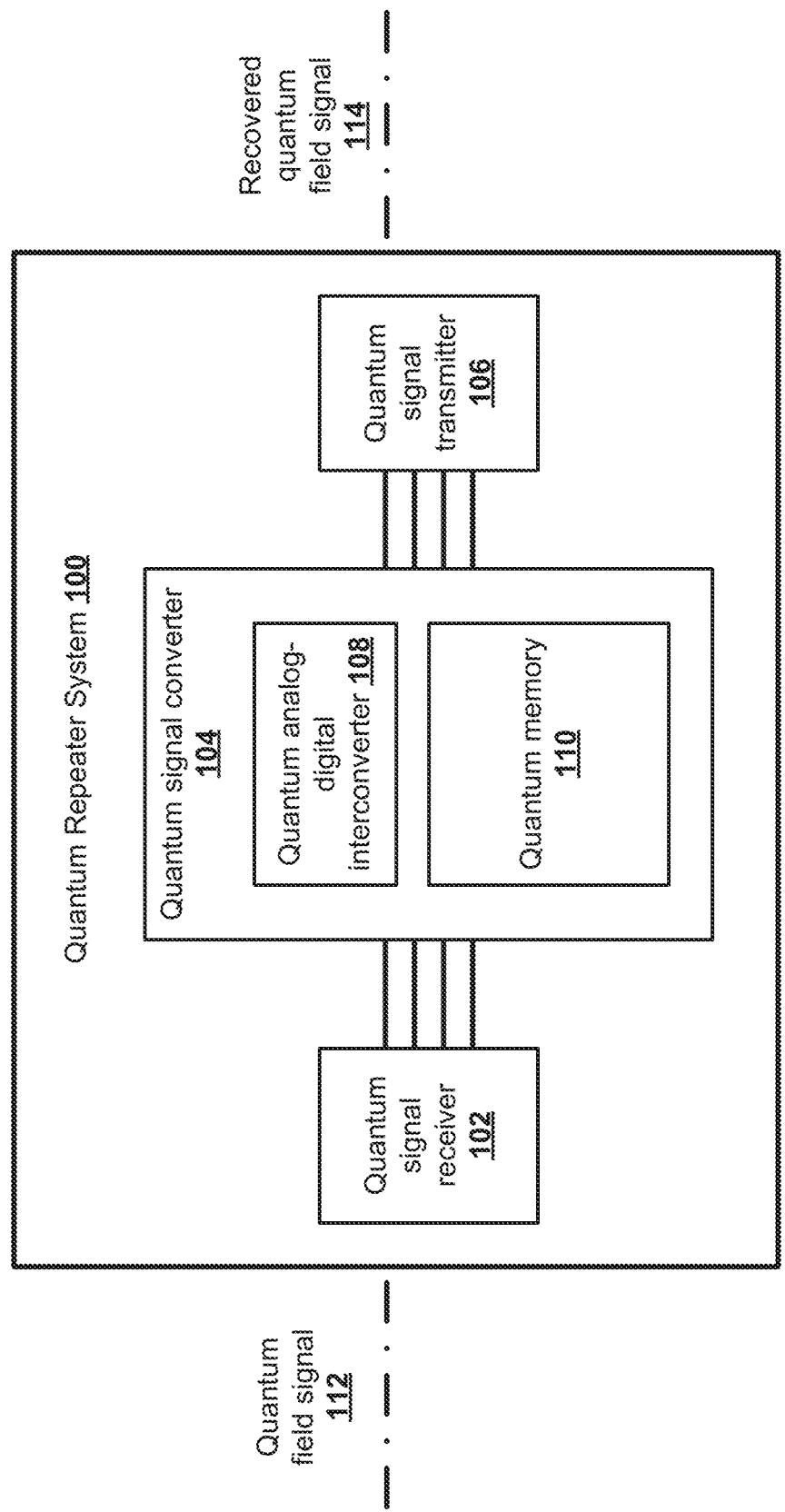
FIG. 1 is a block diagram of an example quantum repeater system.

FIG. 1 is a block diagram of an example quantum repeater system 100 for quantum communication. The system 100 is an example of a system implemented as computer programs on one or more classical and quantum computing devices in one or more locations, in which the systems, components, and techniques described below can be implemented.

The example system 100 includes a quantum signal receiver 102, a signal converter 104, and a quantum signal transmitter 106. The example system 100 is configured to receive as input a quantum field signal, e.g., quantum field signal 112, and process the received quantum signal to generate as output a recovered version of the quantum field signal, e.g., recovered quantum field signal 114. As described in more detail below, in some implementations the recovered quantum field signal can be an error corrected version of the received quantum field signal.

The quantum signal receiver 102 is configured to receive quantum field signals. In some implementations the received quantum field signals can include Gottesman-Kitaev-Preskill (GKP) quantum states. The quantum signal converter 104 is connected to the quantum signal receiver 102 and is configured to sample one or more quantum analog signals from quantum field signals received by the quantum signal receiver 102. For example, the quantum signal converter 104 can be configured to perform operations described below with reference to step 302 of FIG. 3. In implementations where the quantum signal receiver 102 receives a GKP state, the quantum analog signals sampled by the quantum signal converter can be GKP state samples. GKP quantum states are described in more detail below with reference to FIG. 7.

The quantum signal converter 104 is further configured to encode sampled quantum analog signals as corresponding digital quantum information in one or more qudits, e.g., stored in quantum memory 110. The quantum signal converter 104 encodes a sampled quantum analog signal as corresponding digital quantum information by applying a hybrid analog-digital encoding operation to the quantum analog signal and a qudit in an initial state using a quantum analog-digital interconverter 108. An example hybrid analog-digital encoding operation is described below with reference to FIG. 5. An example process that the quantum analog-digital interconverter 108 can be configured to perform for applying a hybrid analog-digital encoding operation to a quantum analog signal and a qudit in an initial state is described below with reference to FIGS. 3-5. An example process for applying a hybrid analog-digital encoding operation to a GKP state sample and a qudit in an initial state is described below with reference to FIG. 8.

The quantum signal converter 104 includes or is connected to a quantum memory 110. As described above, the quantum memory 110 includes one or more qudits (each including one or more qubits) and is configured to store digital quantum information encoded by the quantum signal converter 104. In some implementations the quantum memory 110 is configured to perform error correction operations on digital information that it stores. For example, the quantum memory 110 can be configured to perform one or more quantum error correction codes. Performing an error correction code can include performing syndrome measurements on qubits stored in the memory to determine whether the qubits have been corrupted or not, and applying classical decoders to infer a likely error that occurred. A quantum error correcting feedback operation to correct a detected error on a (logical) qubit can then be performed. Example quantum error correction codes that the memory 110 can be configured to implement include stabilizer codes, codes whose encoding and decoding operations are not necessarily operations in the Clifford group, or approximate error correcting codes.

The quantum signal converter 104 is further configured to decode (error corrected or non-error corrected) digital quantum information stored in the one or more qudits in the quantum memory 110 as a recovered quantum field signal. The quantum signal converter 104 decodes digital quantum information as a corresponding quantum field signal by applying a hybrid digital-analog encoding operation to the one or more qudits storing the digital quantum information and a quantum analog signal in an initial state using the quantum analog-digital interconverter 108. An example hybrid digital-analog encoding operation and an example process that the quantum analog-digital interconverter 108 can be configured to perform for applying a hybrid digital-analog encoding operation to one or more qudits and a quantum analog signal in an initial state is described below with reference to FIG. 6. An example process for applying a hybrid digital-analog encoding operation to one or more qudits and a quantum analog signal in an initial state to produce a corresponding GKP state is described below with reference to FIG. 7.

The quantum signal transmitter 106 is connected to the quantum signal converter 104 and is configured to transmit recovered quantum field signals, e.g., recovered quantum field signal 114 as system output.

For convenience, the example quantum repeater system 100 shown in FIG. 1 includes one quantum signal receiver, quantum signal converter, and quantum signal transmitter. However, in some implementations the system can include multiple quantum signal receivers, quantum signal converters, and quantum signal transmitters, e.g., multiple copies of system 100, connected to form a quantum network.

For purposes of transmitting information to the quantum signal receiver 102 or from the quantum signal transmitter 106, one or more transmission media can be used such as, but not limited to, free space optics, optical fibers, optical cavities, or any other medium where a quantum field can be present (e.g., phonons in a solid material). In an implementation, the one or more qudits (e.g., one or more qubits) of the quantum signal converter 104 and/or the quantum memory 110 can include superconducting qudits (e.g., superconducting qubits). In general, superconducting qubits typically operate in the microwave regime. Accordingly, the quantum signal receiver 102 can convert received signals from an optical signal to a microwave signal. Similarly, the quantum signal transmitter 106 can convert microwave signals to optical signals. Exemplary devices that can be used for the quantum signal receiver 102 and transmitter 106 thus can include, but are not limited to, quantum optomechanical devices, such as described, e.g., in "Microwave-to-optics conversion using a mechanical oscillator in its quantum ground state" by M. Forsch et al., arXiv e-prints p. arXiv:1812.07588v1 (December 2018), or electro-optical devices, such as resonant whispering gallery mode resonators as described, e.g., in "Efficient microwave to optical photon conversion; an electro-optical realization" by A. Rueda et al., Optica, Vol. 3, No. 6, 597-604 (June 2016).

The quantum signal converter 104 and/or the quantum memory 110 can be part of a quantum computer (QC). In the exemplary implementation in which the qudits (or qubits) are superconducting elements, the quantum computer including the quantum signal converter 104 and/or the quantum memory 110 can be contained in a cryostat or other refrigeration device that includes electrical and thermal shielding and that can be operated at or below the critical temperature of the superconducting materials forming the qudits (or qubits). In certain implementations, the QC can include classical control electronics, static analog registers (cavities/resonators, among other types of registers), and internal interconnects that relays the quantum field signal within the QC. The quantum field signal, upon reaching the part of the QC used for analog-digital conversion, can be sampled using, e.g., a form of static (as opposed to flying) oscillators. For instance, the sampling can be performed using a set of superconducting LC circuit or set of resonant cavities. A set of superconducting qudits (or qubits) can be tunably coupled to this latter set of analog qumodes. By tuning the coupling over time using control pulses sent from a set of control electronics, the quantum analog to digital operations can be executed. Subsequently, error correction can be applied.

Figure 2:
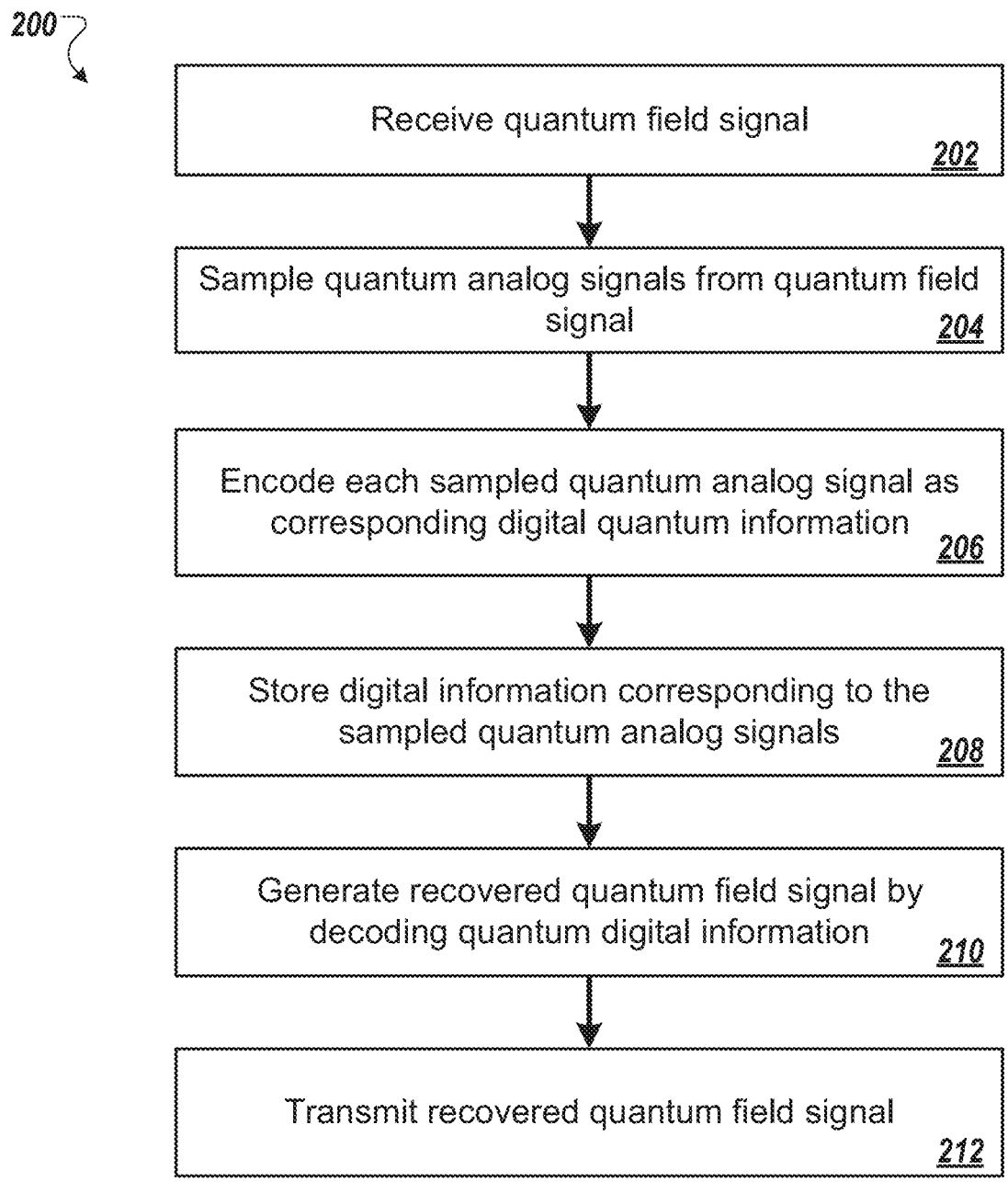
FIG. 2 is a flow diagram of an example process for repeating a quantum field signal.

FIG. 2 is a flow diagram of an example process 200 for repeating a quantum field signal. For convenience, the process 200 will be described as being performed by a system of one or more classical and quantum computing devices located in one or more locations. For example, the quantum repeater system 100 of FIG. 1 can be configured to perform the example process 200.

The system receives a quantum field signal (step 202). In some implementations the receive quantum field signal can be a GKP state.

The system samples one or more quantum analog signals from the received quantum field signal (step 204). In cases where the received quantum field is a GKP state, the one or more quantum analog signals can include one or more GKP state samples. Sampling one or more quantum analog signals from a received quantum field signal is described in more detail below with reference to step 302 of FIG. 3.

For each sampled quantum analog signal, the system encodes the quantum analog signal as corresponding digital quantum information (step 206) and stores the corresponding digital quantum information in a qudit (step 208). Encoding the quantum analog signal as corresponding digital quantum information includes applying a hybrid analog-digital encoding operation to the quantum analog signal and the qudit in an initial state, as described in more detail below with reference to step 304 of FIG. 3.

In some implementations the system can perform one or more rounds of quantum error correction on the stored qudits in order to keep the quantum state stored in memory error-free while waiting for next steps in transmission.

The system generates a recovered quantum field signal by, for each qudit storing corresponding digital quantum information, decoding the quantum digital information by applying a hybrid digital-analog decoding operation to the qudit and a quantum analog register in an initial state (step 210). In implementations where the system performs one or more rounds of quantum error correction on the stored qudits, the system can generate a recovered quantum field signal by decoding the error corrected quantum digital information. Decoding quantum digital information by applying a hybrid digital-analog decoding operation to a qudit and a quantum analog register in an initial state is described in more detail below with reference to step 604 of FIG. 6.

The system combines the decoded quantum digital information and transmits the recovered quantum field signal (step 212).

Figure 3:
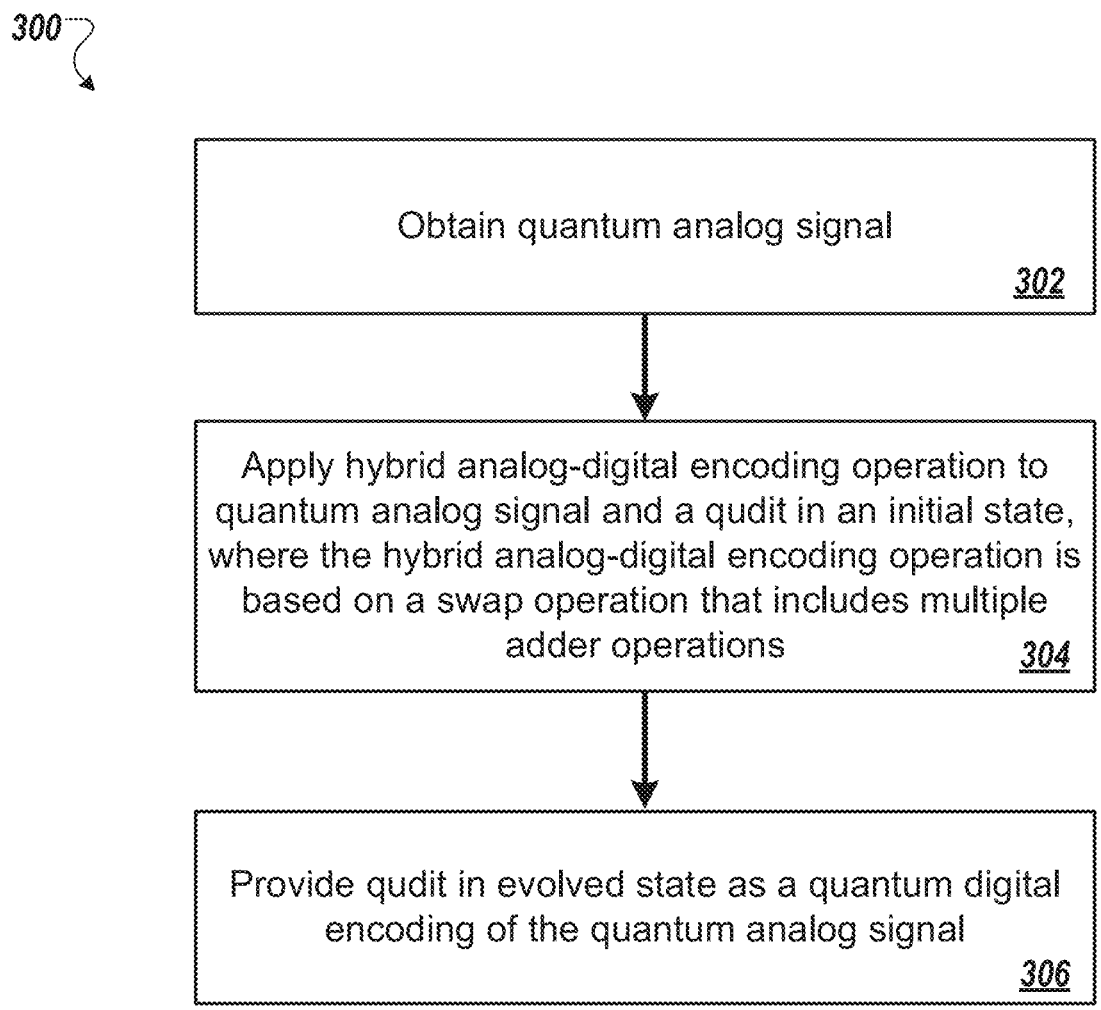
FIG. 3 is a flow diagram of an example process for generating a quantum digital encoding of a quantum analog signal.

FIG. 3 is a flow diagram of an example process 300 for generating a quantum digital encoding of a quantum analog signal. For convenience, the process 300 will be described as being performed by a system of one or more classical and quantum computing devices located in one or more locations. For example, the quantum repeater system 100 of FIG. 1 can be configured to perform the example process 300.

The system obtains a quantum analog signal (step 302). The quantum analog signal can include a quantum mode of a quantum field and a quantum mode amplitude sampled from an interval of space, frequency, or a general window function profile of the quantum field. In some implementations the quantum mode amplitude can be an average field amplitude value determined according to a predetermined window function, e.g., a wavelet, and a quantum field operator corresponding to the quantum field.

In some implementations the system can obtain the quantum analog signal by sampling the quantum mode and quantum mode amplitude of the quantum field, e.g., using a resonator coupled to the quantum field. In these implementations the system can store the sampled quantum mode and quantum mode amplitude in an analog register, e.g., in the resonator coupled to the quantum field.

To sample the quantum mode and quantum mode amplitude of the quantum field, the system can transfer quantum information from the quantum field onto a quantum mode (a continuous-variable quantum analog degree of freedom or memory, e.g. a quantum harmonic oscillator) through application of an analog swap operation to the quantum analog signal and the quantum mode. This can include coupling the two quantum degrees of freedom via a form of controllable coupling in order to convert a given sample contained in the "flying" memory (e.g. electromagnetic signal moving at the speed of light) onto a stationary quantum analog memory element, e.g., on a chip. The analog swap operation can be applied by implementing a unitary operator $$\hat{U}_{jk} = e^{i\frac{\pi}{2}(\hat{a}_j^\dagger \hat{a}_k + \hat{a}_j \hat{a}_k^\dagger)}$$

where $\hat{a}_k$ and $\hat{a}_j$ represent photon annihilation operators of the k-th and j-th quantum mode respectively. In some implementations the index j can label a sample subspace of the quantum field, and the index k can label the stationary quantum mode on the chip. This unitary swap is the result of an evolution under photon exchange interaction, commonly occurring in beam splitters in optical systems, or whenever two bosonic quantum modes are in resonance with one another (i.e. strongly coupled).

The system applies a hybrid analog-digital encoding operation to the quantum analog signal and a qudit in an initial state to obtain an evolved state of the qudit (step 304). The qudit includes a $d=2^N$ dimensional quantum register represented by N qubits, where N is selected based on a predetermined target encoding precision. The qudit can be prepared in an arbitrary initial state. During the process 300 the state of the qudit will be transferred to the quantum analog signal, which enables simultaneous emission and receiving of quantum information. In the case of example process 300, the quantum analog signal is being encoded as quantum digital information and therefore the transfer of the initial state of the qudit to the quantum analog signal is not of primary importance. However, for certain initial qudit states, some operations of the example process 300 can be eliminated. For example, if the qudit is prepared in a |0> state, a first adder operation in the swap operation described below can be omitted since applying an adder operation to the |0> state leaves the system invariant and thus the operation can be omitted.

The hybrid analog-digital encoding operation is based on a swap operation that operates on two signals—a first signal and a second signal—and includes multiple adder operations. In some implementations the multiple adder operations can include three adder operations. The swap operation can also include multiple quantum Fourier transformations. For example, the swap operation can include a first adder operation applied to a first signal and a second signal, two sequential Fourier transformations applied to the second signal, a second adder operation applied to the first signal and the second signal, two sequential Fourier transformations applied to the first signal, a third adder operation applied to the first signal and the second signal, and two sequential Fourier transformations applied to the second signal.

The swap operation can be an analog swap operation that operates on a first quantum analog signal and a second quantum analog signal and swaps information stored in the first quantum analog signal and the second quantum analog signal. In this case the above described first adder operation and third adder operation represent a unitary transformation $$U_1 = e^{i\hat{\phi}_1 \hat{\pi}_2}$$

that includes a canonical field position operator $\hat{\phi}_1$ for the first quantum analog signal and a canonical field momentum operator $\hat{\pi}_2$ for the second quantum analog signal. The second adder operation represents a unitary transformation $$U_2 = e^{i\hat{\pi}_1 \hat{\phi}_2}$$

comprising a canonical field momentum operator $\hat{\pi}_1$ for the first quantum analog signal and a canonical field position operator $\hat{\phi}_2$ for the second quantum analog signal. However, in practice, a more efficient implementation of an analog swap operation can be achieved through evolution under photon exchange interaction, as described above.

Alternatively, the swap operation can be a digital swap operation that operates on a first quantum digital signal and a second quantum digital signal and swaps information stored in the first quantum digital signal and the second quantum digital signal. In this case the above described first adder operation, second adder operation and third adder operation represent a unitary transformation $U = e^{i\hat{J}_1 \hat{J}_2}$ that includes a first qudit clock operator generator $\hat{J}_1$ for the first quantum digital signal and a second qudit clock operator generator $\hat{J}_2$ for the second quantum digital signal.

Figure 4:
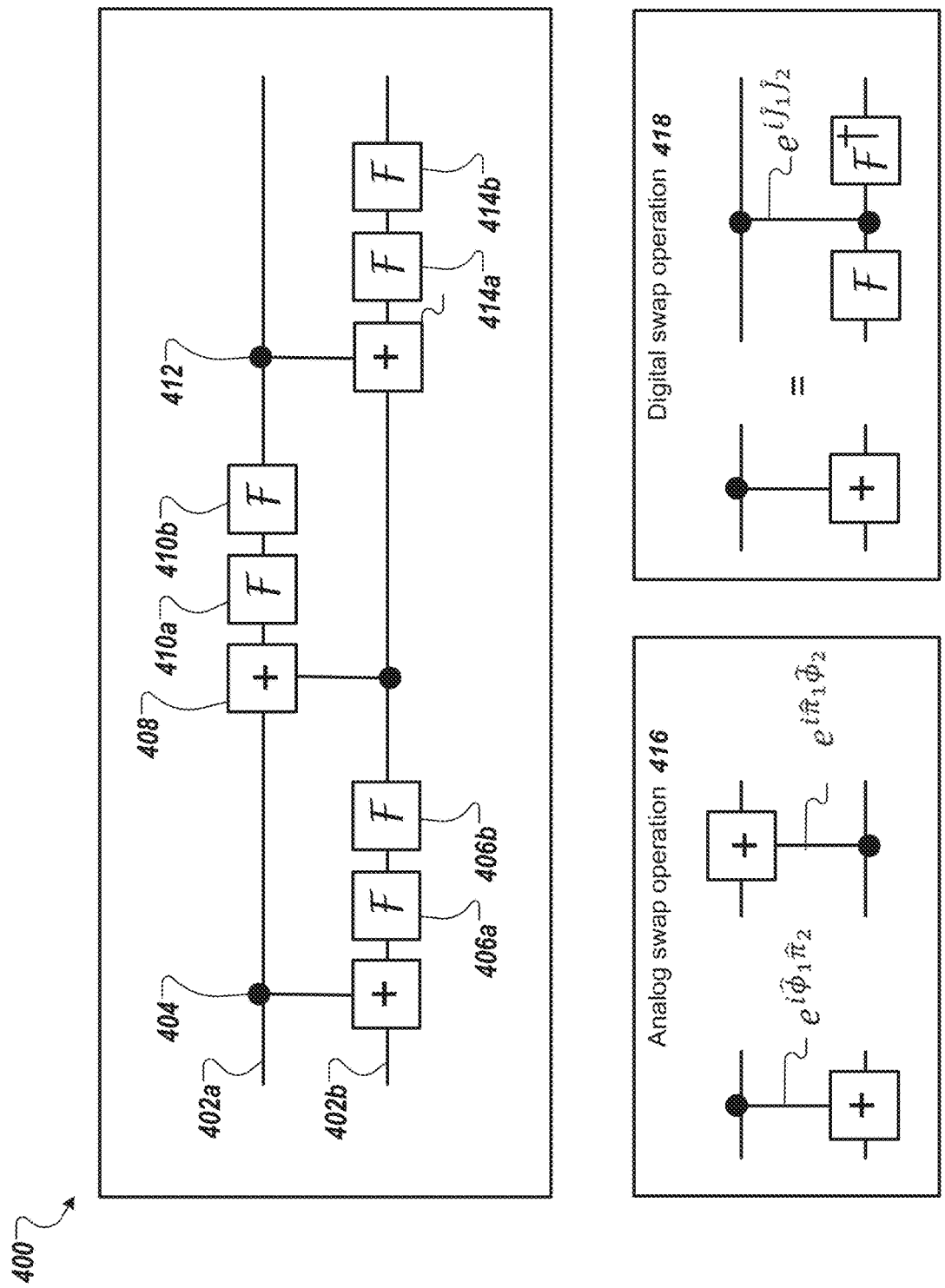
FIG. 4 shows an example swap operation.

FIG. 4 shows an example swap operation 400 applied to a first signal 402a and a second signal 402b. As described above, the first signal 402a and second signal 402b can both be quantum analog signals or both be quantum digital signals. If the first signal 402a and second signal 402b are quantum analog signals, the adder operations 404, 408 and 412 represent the unitary transformations given in the legend 416. If the first signal 402a and second signal 402b are quantum digital signals, the adder operations 404, 408 and 412 represent the unitary transformations given in the legend 418.

During application of the example swap operation 400, a first adder operation 404 is applied to the first signal 402a and the second signal 402b. Two quantum Fourier transformations 406a, 406b are then sequentially applied to the second signal 402b. In practical implementations, sequential application of two quantum Fourier transforms to an analog quantum signal can be achieved through a single operation that includes application of a pi pulse to the analog quantum signal, e.g.

$$\hat{U} = F_j^2 = e^{i\pi(\hat{a}_j^\dagger \hat{a}_j)}.$$

Application of the pi pulse represents an evolution under a quantum harmonic oscillator Hamiltonian for an angle (i.e., time multiplied by angular frequency) $\pi$.

A second adder operation 408 is then applied to the first signal 402a and the second signal 402b. Two quantum Fourier transformations 410a, 410b are then sequentially applied to the first signal 402a. Again, in practical implementations sequential application of the two quantum Fourier transforms can be achieved through application of a pi pulse to the first signal 402a.

A third adder operation 412 is then applied to the first signal 402a and the second signal 402b. The third adder operation is the same as the first adder operation 404. Two quantum Fourier transformations 414a, 414b are then sequentially applied to the second signal 402b. Again, in practical implementations sequential application of the two quantum Fourier transforms can be achieved through application of a pi pulse to the second analog quantum signal 402b.

Returning to FIG. 3, the hybrid analog-digital encoding operation that is based on the above described swap operation includes a first unitary transformation that includes a canonical field momentum operator and a qudit field operator. The qudit field operator is given by a linear combination of qudit clock operator generators $\hat{J}_{d=2^N} = \Sigma_{n=1}^{N} 2^{n-2} (\hat{I}_2^{(n)} - Z_2^{(n)})$, where $\hat{I}_2^{(n)}$ represents a 2×2 identity operator acting on qubit n and $Z_2^{(n)}$ represents a Pauli Z operator acting on qubit n, and identity operators. For example, the qudit field operator can be given by $$\Phi_d = \frac{(b-a)}{(d-1)} \hat{J}_d + a \hat{I}_d$$

where $\hat{I}_d$ represents a d×d identity operator and [a, b] represents a quantum analog sampling interval where a and b are tunable parameters which can be tuned to sample from different values of position.

The hybrid analog-digital encoding operation also includes multiple quantum Fourier transformations, and a second unitary transformation that includes a canonical field position operator and the qudit field operator. Because the qudit includes a $d=2^N$ dimensional quantum register represented by N qubits, applications of the first unitary transformation and the second unitary transformation to states of the qudit involves applying corresponding qubit transformations to respective states of the N qubits.

The hybrid analog-digital encoding operation is approximately equivalent to the swap operation, e.g., up to a given fidelity, precision and/or range limits determined by the dimension of the qudit (number of qubits).

Figure 5:
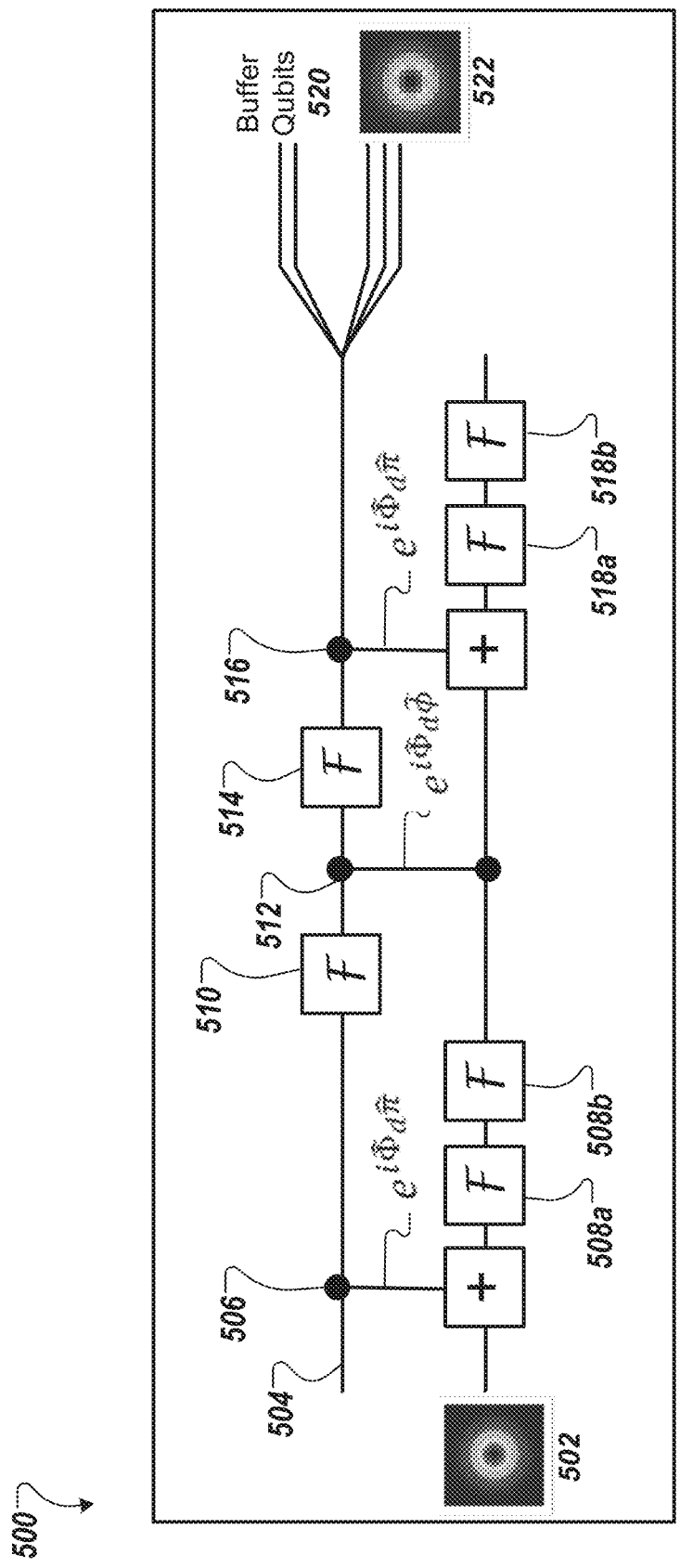
FIG. 5 shows an example hybrid analog-digital encoding operation.

FIG. 5 shows an example hybrid analog-digital encoding operation 500. The example hybrid analog-digital encoding operation 500 is described as being applied to a quantum analog signal 502 and a qudit 504 prepared an initial state, where the qudit represents a $d=2^N$ dimensional quantum register that includes N qubits. However, the example hybrid analog-digital encoding operation 500 could also be applied directly to the quantum analog signal 502 and the N qubits, i.e., the quantum analog signal 502 could also be coupled directly to the N qubits.

During application of the example hybrid analog-digital encoding operation 500, a first unitary transformation 506 is applied to the quantum analog signal 502 and the initial state of the qudit 504 to obtain a first modified quantum analog signal and a first evolved state of the qudit. The first unitary transformation includes a canonical field position operator $\hat{\Phi}_d$ for the qudit 504 and a canonical field momentum operator $\hat{\pi}$ for the quantum analog signal 502. That is, the first unitary transformation is given by $$U = e^{i \hat{\Phi}_d \hat{\pi}}.$$

Since the qudit represents a $d=2^N$ dimensional quantum register represented by N qubits, application of the first unitary transformation 506 represents an evolution under multiple one-to-one interactions between each of the N qubits and the stationary quantum analog signal 502. That is, the first unitary transformation 506 can represent a total evolution under each of the one-to-one interactions, e.g., a product of individual unitary transformations.

Two quantum Fourier transformations 508a, 508b are then sequentially applied to the first modified quantum analog signal to obtain a second modified quantum analog signal. As described above with reference to FIG. 4, in practical implementations sequential application of two quantum Fourier transforms to a quantum analog signal can be achieved through application of a pi pulse to the analog quantum signal.

A quantum Fourier transformation 510 is applied to the first evolved state of the qudit to obtain a second evolved state of the qudit. A second unitary transformation 512 is applied to the second modified quantum analog signal and the second evolved state of the qudit to obtain a third modified quantum analog signal and a third evolved state of the qudit. The second unitary transformation includes a canonical field position operator $\hat{\Phi}_d$ for the qudit 504 and a canonical field position operator $\hat{\Phi}$ for the quantum analog signal 502. That is, the second unitary transformation is given by $$U = e^{i \hat{\Phi}_d \hat{\phi}}.$$

A quantum Fourier transformation 514 is applied to the third evolved state of the qudit to obtain a fourth evolved state of the qudit.

The first unitary transformation 516 is then applied to the third modified quantum analog signal and the fourth evolved state of the qudit to obtain a fourth modified quantum analog signal and a fifth evolved state of the qudit. The fifth evolved state of the qudit can be provided as a quantum digital encoding 522 of the received quantum analog signal, as described below with reference to step 306 of FIG. 3.

Application of the example hybrid analog-digital encoding operation 500 can also include sequentially applying two quantum Fourier transformations 518a, 518b to the fourth modified quantum analog signal. Application of the two quantum Fourier transformations 518a, 518b is not essential for the encoding process 300, however the two quantum Fourier transformations 518a, 518b must be included in the example hybrid analog-digital encoding operation 500 if the encoding operation is to be a swap operation, i.e., if the example hybrid analog-digital encoding operation 500 is to be a reversible operation.

Returning to FIG. 3, the system provides the qudit in the evolved state as a quantum digital encoding of the received quantum analog signal (step 306). Alternatively or in addition, the system can store the quantum digital encoding of the received quantum analog signal in quantum memory.

In some implementations the system can discard one or more of the N qubits to reduce the resolution of the quantum digital encoding of the received quantum analog signal when providing the qudit in the fifth evolved state as the quantum digital encoding of the received quantum analog signal. This process is illustrated in FIG. 5, where a first number of the N qubits represented by the qudit 504 are provided as the quantum digital encoding 522 of the quantum analog signal 502, and a second number of the N qubits represented by the qudit 504 are buffer qubits 520 and are discarded.

The example process 300 can be repeated to generating multiple quantum digital encodings of respective quantum analog signals. For example, at step 302 the system can receive multiple quantum analog signals where each of the multiple quantum analog signals includes a respective quantum mode of a same quantum field, e.g., where the respective quantum modes of the same quantum field form a basis, and a respective quantum mode amplitude sampled from an interval of the quantum field. In some implementations the multiple quantum analog signals can include quantum analog signals that include a same quantum mode and respective quantum mode amplitudes sampled from different intervals of the quantum field, e.g., where the different sampling intervals of the quantum field are selected based on a Nyquist-Shannon sampling rate.

The system can then apply the hybrid analog-digital encoding operation to each of the multiple quantum analog signals and a qudit in an initial state to obtain multiple qudits in respective evolved states as a quantum digital encoding of the multiple quantum analog signals. In this example, the provided quantum digital encodings of the received multiple quantum analog signals can form a quantum digital encoding of the quantum field.

In some implementations the system can sequentially sample and apply the hybrid analog-digital encoding operation to each of the multiple quantum analog signals. In these implementations the system can apply a hold operation to the analog quantum modes in memory during application of each hybrid analog-digital encoding operation.

Figure 6:
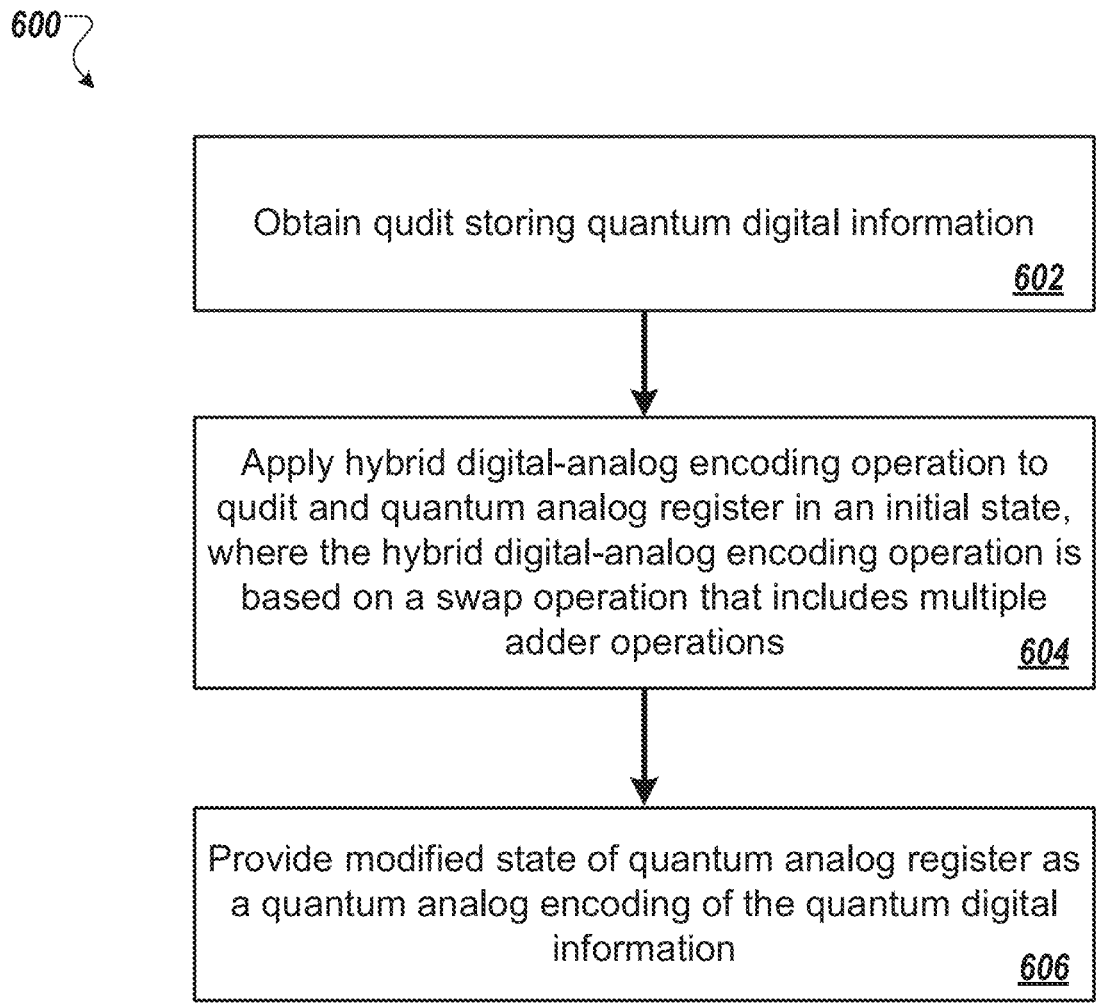
FIG. 6 is a flow diagram of an example process for generating a quantum analog encoding of quantum digital information stored in a qudit.

FIG. 6 is a flow diagram of an example process 600 for generating a quantum analog encoding of quantum digital information stored in a qudit. For convenience, the process 400 will be described as being performed by a system of one or more classical and quantum computing devices located in one or more locations. For example, the quantum repeater system 100 of FIG. 1 can be configured to perform the example process 600.

The system obtains a qudit that stores quantum digital information (step 602). The qudit includes a $d=2^N$ dimensional quantum register represented by N qubits. In some implementations N can be selected based on a predetermined target encoding precision. For example, in some cases the N qubits can include additional qubits, i.e., qubits that do not store the quantum digital information that is to be encoded as a quantum analog signal, to increase the resolution of the quantum analog encoding of the quantum digital information (to give more range in signal phase space, as well as finer-grained precision/sharpness, i.e. a low fine-grained precision state would seem blurry. By tuning the dimension of the system, this range in phase space can be tuned. Phase space is the space of position and momentum of each signal, depicted as input and output 302 and 322 in FIG. 3).

The system applies a hybrid digital-analog encoding operation to the qudit and a quantum analog register in an initial state to obtain a modified state of the quantum analog register (step 604). The initial state of the quantum analog register can include one or more quantum modes, as described above with reference to FIG. 3. In some implementations the initial state can be a vacuum state or a thermal state, however any state of known range in amplitude and momentum could be used. The use of states with unknown ranges in amplitude and momentum could incur some dithering/aliasing effects, similar to classical under sampling effects. Therefore, if an initial state with amplitude and momentum outside of a known range is used, a non-negligible probability of error can need to be tolerated.

The hybrid digital-analog encoding operation is based on the swap operation described above with reference to FIGS. 3 and 4, and for brevity is not described again. In addition, application of the hybrid digital-analog encoding operation is the same as a reverse application of the hybrid analog-digital encoding operation (including quantum Fourier transformations 518a, 518b) described above with reference to FIGS. 3 and 5, since the example hybrid analog-digital encoding operation illustrated in FIG. 3 is a swap operation and therefore reversible.

Therefore, applying the hybrid digital-analog swap operation to the qudit and the quantum analog register in the initial state includes: sequentially applying the Fourier transformations 518a, 518b of FIG. 5 (or a pi pulse as described above) to the quantum analog register 502 in the initial state to obtain a first modified state of the quantum analog register. The first unitary transformation 516 is then applied to the first modified state of the quantum analog register and the qudit 504 to obtain a second modified state of the quantum analog register and a first evolved state of the qudit. The Fourier transformation 514 is then applied to the first evolved state of the qudit to obtain a second evolved state of the qudit. The second unitary transformation 512 is then applied to the second modified state of the quantum analog register and the second evolved state of the qudit to obtain a third modified state of the quantum analog register and a third evolved state of the qudit. The Fourier transformation 510 is then applied to the third evolved state of the qudit to obtain a fourth evolved state of the qudit. The Fourier transformations 508a, 508b (or a pi pulse as described above) are then sequentially applied to the third modified state of the quantum analog register to obtain a fourth modified state of the quantum analog register. The first unitary transformation 506 is then applied to the fourth modified state of the quantum analog register and the fourth evolved state of the qudit to obtain a fifth modified state of the quantum analog register. The fifth modified state of the quantum analog register is then provided as a quantum analog encoding of the quantum digital information (step 606).

The example process 600 can be repeated to generating multiple quantum analog encodings of respective quantum digital information stored in multiple qudits. For example, at step 602 the system can receive multiple qudits, where each qudit stores respective quantum digital information. The system can then apply the hybrid digital-analog swap operation to each qudit and a quantum analog register in an initial state to obtain multiple modified states of quantum analog registers as a quantum analog encoding of the quantum digital information. In some implementations the states of the quantum analog registers can be combined to produce a quantum field that encodes the information stored in the multiple qudits. For example, the quantum field can interact with the quantum analog registers (analog memory quantum modes) in a similar way to that described above with reference to FIG. 3—through swapping interactions of the form $$\hat{U}_{jk} = e^{i\frac{\pi}{2}\left(\hat{a}_j^\dagger \hat{b}_k + \hat{a}_j \hat{b}_k^\dagger\right)}$$

where $\hat{a}_j$ represents the annihilation operator of memory quantum mode j and $\hat{b}_k$ represents the annihilation operator of smeared observable subsystem k (window of quantum field). An example of a set of smeared observable subsystems is: $\hat{\phi}_j \equiv \int dx \lambda_j(x) \hat{\Phi}(x)$ where $\lambda_j$ represents L^2-normalized window functions and $\Phi(x)$ represents the quantum field amplitude at point x. The canonical conjugate of these amplitude observables are $\hat{\pi}_j \equiv \int dx \lambda_j(x) \hat{\Pi}(x)$ with the same normalized window function, and $\Pi(x)$ represents the quantum field canonical conjugate to the amplitude at point x. The annihilation operators are defined as $$\hat{b}_j = \frac{1}{\sqrt{2}}\left(\hat{\phi}_j + i\hat{\pi}_j\right)$$

and the corresponding creation operator is the Hermitian conjugate.

Figure 7:
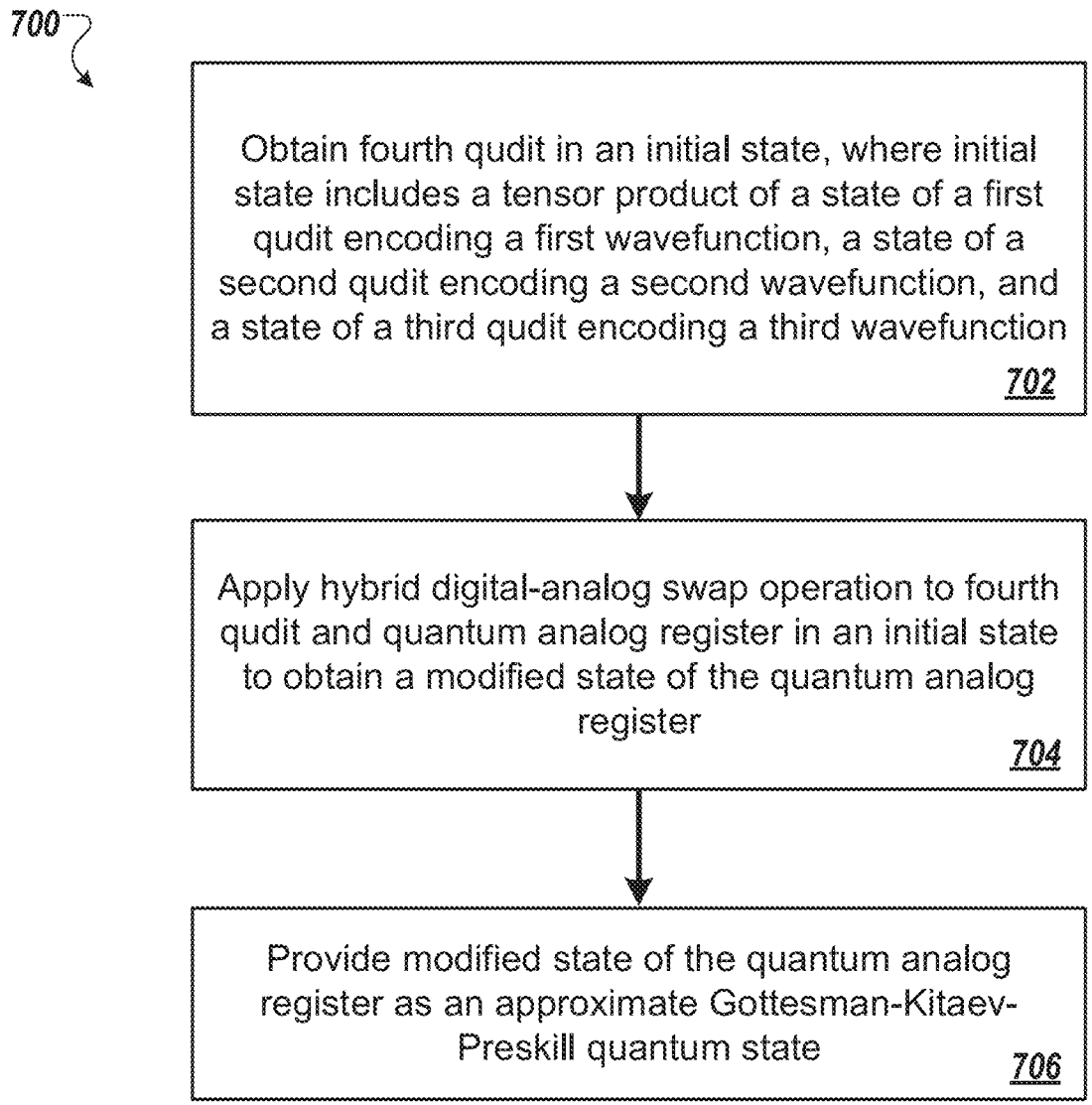
FIG. 7 is a flow diagram of an example process for generating a Gottesman-Kitaev-Preskill quantum state.

FIG. 7 is a flow diagram of an example process 700 for generating a target GKP quantum state. The target GKP state includes a series of Gaussian peaks of target width $\sigma$ and target tunable separation $\alpha\sqrt{\pi}$, $\alpha \in \mathbb{R}$ embedded in a larger Gaussian envelope of target width $1/\sigma$. Although in the case of infinite squeezing ($\alpha \to 0$) the GKP state bases become orthogonal, in the case of finite squeezing, the approximate code states are not orthogonal. The approximate GKP code states $|0\rangle$ and $|1\rangle$ can be defined as $$|0\rangle \propto \sum_{t=-\infty}^{\infty} \int e^{-2\pi\sigma^2 t^2} e^{-(q-2t\sqrt{\pi})^2/(2\sigma^2)} |q\rangle \, dq$$

$$|1\rangle \propto \sum_{t=-\infty}^{\infty} \int e^{-\frac{\pi\sigma^2(2t+1)^2}{2}} e^{-(q-(2t+1)\sqrt{\pi})^2/(2\sigma^2)} |q\rangle \, dq.$$

For convenience, the process 700 will be described as being performed by a system of one or more classical and quantum computing devices located in one or more locations. For example, the quantum repeater system 100 of FIG. 1 can be configured to perform the example process 700.

The system obtains a fourth qudit in an initial state (step 702). The initial state of the fourth qudit includes a tensor product of a state of a first qudit, a state of a second qudit, and a state of a third qudit. The state of the first qudit encodes the Gaussian envelope of target width $1/\sigma$. The state of the first qudit can be represented by a first Gaussian wavefunction. The state of the second qudit encodes the target separation $\alpha\sqrt{\pi}$. That is, the state of the second qudit includes logical information that determines a position of the Gaussian peaks of target width $\sigma$. The state of the second qubit can be a general superposition sate. The state of a third qudit encodes the target width $\sigma$. The state of the third qudit can be represented by a second Gaussian wavefunction.

The fourth qudit can include a $d=2^N$ dimensional quantum register represented by N qubits. For example, the first qudit can include a first multiple of qubits, the second qudit can include a second multiple of qubits, and the third qudit can include a third multiple of qubits, where the first multiple added to the second multiple added to the third multiple is equal to $d=2^N$.

The merging of the first, second and third qudits to produce the fourth qudit can include labelling the qubits of the first, second and third qudits in order of precision, i.e., what power of the position value the qubit represents. For example, by appending two multi-qubit qudit registers, the original intra-sub-qudit ordering is maintained. However, the collection of all qubits are considered as forming one larger-dimensional qudit. For the presently described GKP construction, three different qudits are merged. Each qudit determines a wavefunction for intervals of precision. For the low-precision, e.g., large-scale features, the first qudit determines the shape of the larger Gaussian envelope of width $1/\sigma$. The second qudit represents mid-precision and contains logical information including superpositions of different positions for the next tier's wavefunction (the higher precision). The third qudit represents high precision. The third qudit wavefunction determines the Gaussian peaks of target width $\sigma$ (the finest grain information). All three qudits put together as a tensor product and considered as a single qudit (fourth qudit) approximating a continuous one-dimensional quantum system result in a wavefunction that includes a superposition (depending on logical information) of the Gaussian approximate Dirac combs described above. The variances of the Gaussians of the outer larger Gaussian envelope and Gaussian peaks can be tuned. In general it can be beneficial to keep these dual to each other, such that the Fourier transform of the wavefunction is also a Gaussian approximate Dirac comb.

The system applies a hybrid digital-analog swap operation to the fourth qudit and a quantum analog register in an initial state to obtain a modified state of the quantum analog register (step 704). The hybrid digital-analog swap operation is based on a swap operation that includes multiple adder operations. An example hybrid digital-analog swap operation and an example process for applying a hybrid digital-analog swap operation to a qudit and a quantum analog register in an initial state is described below with reference to FIGS. 4-6.

The system provides the modified state of the quantum analog register as an approximate Gottesman-Kitaev-Preskill quantum state (step 706). In some implementations the approximate Gottesman-Kitaev-Preskill quantum state can be provided for use in a quantum computation or quantum communication protocol or method. For example, the approximate Gottesman-Kitaev-Preskill quantum state can be transmitted to a quantum repeater, where the quantum repeater can receive the transmitted Gottesman-Kitaev-Preskill quantum state, perform analog error correction operations on the received Gottesman-Kitaev-Preskill quantum state to obtain an error corrected Gottesman-Kitaev-Preskill quantum state, and re-transmit the error corrected Gottesman-Kitaev-Preskill quantum state.

Figure 8:
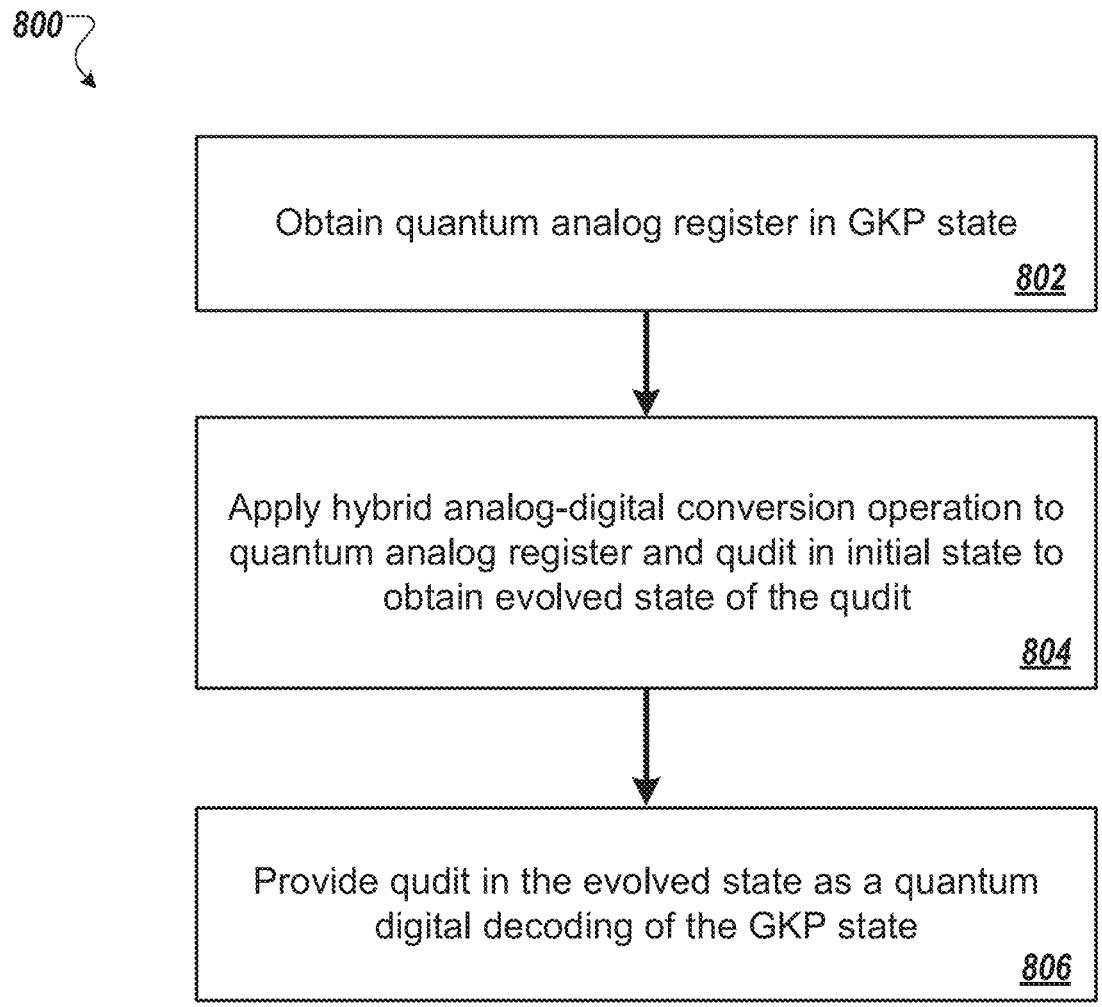
FIG. 8 is a flow diagram of an example process for converting a Gottesman-Kitaev-Preskill quantum state to quantum digital information.

FIG. 8 is a flow diagram of an example process 800 for converting a Gottesman-Kitaev-Preskill quantum state to quantum digital information. For convenience, the process 800 will be described as being performed by a system of one or more classical and quantum computing devices located in one or more locations. For example, the quantum repeater system 100 of FIG. 1 can be configured to perform the example process 800.

The system obtains a quantum analog register in a GKP quantum state (step 802).

The system applies a hybrid analog-digital conversion operation to the quantum analog register and a qudit in an initial state to obtain an evolved state of the qudit (step 804). The hybrid analog-digital swap operation is based on a swap operation that includes multiple adder operations. An example hybrid analog-digital swap operation and an example process for applying a hybrid digital-analog swap operation to a quantum analog register in a given state and a qudit in an initial state is described below with reference to FIGS. 3-5.

The system provides the qudit in the evolved state as a quantum digital decoding of the GKP quantum state (step 806).

Implementations of the digital and/or quantum subject matter and the digital functional operations and quantum operations described in this specification can be implemented in digital electronic circuitry, suitable quantum circuitry or, more generally, quantum computational systems, in tangibly-embodied digital and/or quantum computer software or firmware, in digital and/or quantum computer hardware, including the structures disclosed in this specification and their structural equivalents, or in combinations of one or more of them. The term "quantum computational systems" can include, but is not limited to, quantum computers, quantum information processing systems, quantum cryptography systems, or quantum simulators.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital and/or quantum information, e.g., a machine-generated electrical, optical, or electromagnetic signal, that is generated to encode digital and/or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that can be suitably approximated as a two-level system in the corresponding context. Such quantum systems can include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, multiple digital and quantum processors or computers, and combinations thereof. The apparatus can also be, or further include, special purpose logic circuitry, e.g., an FPGA (field programmable gate array), an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that can transmit quantum data using quantum systems, e.g. qubits. Generally, a digital data communication network cannot transmit quantum data, however a quantum data communication network can transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers to be "configured to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer can receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum processors or both, or any other kind of central digital and/or quantum processing unit. Generally, a central digital and/or quantum processing unit will receive instructions and digital and/or quantum data from a read-only memory, a random access memory, or quantum systems suitable for transmitting quantum data, e.g. photons, or combinations thereof.

The essential elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or system that can include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A quantum repeater system for quantum communication, the system comprising:
    a quantum signal receiver configured to receive a quantum field signal;
    a quantum signal converter connected to the quantum signal receiver, wherein the quantum signal converter is configured to:
        sample one or more quantum analog signals from the quantum field signal received by the quantum signal receiver;
        encode sampled quantum analog signals as corresponding digital quantum information in one or more qudits, comprising, for each sampled quantum analog signal, applying a hybrid analog-digital encoding operation to the quantum analog signal and a qudit in an initial state;
        decode digital quantum information stored in the one or more qudits as a recovered quantum field signal, comprising, for each of the one or more qudits, applying a hybrid digital-analog decoding operation to the qudit and a quantum analog register in an initial state;
    a quantum memory connected to the quantum signal converter, wherein the quantum memory comprises one or more qudits and is configured to store digital quantum information encoded by the quantum signal converter; and
    a quantum signal transmitter connected to the quantum signal converter, wherein the quantum signal transmitter is configured to transmit the recovered quantum field signal.

2. The quantum repeater system of claim 1, wherein:
    the received quantum field signal comprises a Gottesman, Kitaev and Preskill (GKP) state;
    the one or more quantum analog signals sampled by the quantum signal converter comprise one or more GKP state samples; and
    the recovered quantum field signal comprises a recovered GKP state.

3. The quantum repeater system of claim 2, wherein the quantum error correction operations comprise syndrome measurements, classical decoder operations and quantum error correcting feedback operations.

4. The quantum repeater system of claim 2, wherein the quantum signal converter is further configured to decode error corrected digital quantum information stored in the one or more qudits as a recovered quantum field signal.

5. The quantum repeater system of claim 1, wherein the quantum memory is further configured to perform quantum error correction operations on digital quantum information stored in the quantum memory.

6. The quantum repeater system of claim 1, further comprising multiple quantum signal receivers, quantum signal converters, quantum memories, and quantum signal transmitters connected to form a quantum network.

7. The quantum repeater system of claim 1, wherein the hybrid analog-digital encoding operation and the hybrid digital-analog decoding operation are based on a swap operation comprising three adder operations.

8. The quantum repeater system of claim 7, wherein applying the hybrid analog-digital encoding operation to the quantum analog signal and a qudit in an initial state comprises:
applying the first unitary transformation to the quantum analog signal and the initial state of the qudit to obtain a first modified quantum analog signal and a first evolved state of the qudit; sequentially applying two Fourier transformations to the first modified quantum analog signal to obtain a second modified quantum analog signal;
applying a Fourier transformation to the first evolved state of the qudit to obtain a second evolved state of the qudit;
applying the second unitary transformation to the second modified quantum analog signal and the second evolved state of the qudit to obtain a third modified quantum analog signal and a third evolved state of the qudit;
applying a Fourier transformation to the third evolved state of the qudit to obtain a fourth evolved state of the qudit; and
applying the first unitary transformation to the third modified quantum analog signal and the fourth evolved state of the qudit to obtain a fifth evolved state of the qudit, wherein providing the qudit in the evolved state as a quantum digital encoding of the received quantum analog signal comprises providing the qudit in the fifth evolved state as a quantum digital encoding of the received quantum analog signal.

9. The quantum repeater system of claim 1, wherein the hybrid analog-digital encoding operation and the hybrid digital-analog decoding operation comprise:
a first unitary transformation comprising a canonical field momentum operator and a qudit field operator;
multiple Fourier transformations; and
a second unitary transformation comprising a canonical field position operator and the qudit field operator.

10. The quantum repeater system of claim 7, wherein applying the hybrid digital-analog decoding operation to the qudit and a quantum analog register in an initial state comprises:
sequentially applying two Fourier transformations to the quantum analog register in the initial state to obtain a first modified state of the quantum analog register;
applying a first unitary transformation to the first modified state of the quantum analog register and the qudit to obtain a second modified state of the quantum analog register and a first evolved state of the qudit, wherein the first unitary transformation comprises a canonical field momentum operator and a qudit field operator;
applying a Fourier transformation to the first evolved state of the qudit to obtain a second evolved state of the qudit;
applying a second unitary transformation to the second modified state of the quantum analog register and the second evolved state of the qudit to obtain a third modified state of the quantum analog register and a third evolved state of the qudit, wherein the second unitary transformation comprises a canonical field position operator and the qudit field operator;
applying a Fourier transformation to the third evolved state of the qudit to obtain a fourth evolved state of the qudit;
sequentially applying two Fourier transformations to the third modified state of the quantum analog register to obtain a fourth modified state of the quantum analog register; and
applying the first unitary transformation to the fourth modified state of the quantum analog register and the fourth evolved state of the qudit to obtain a fifth modified state of the quantum analog register, wherein providing the modified state of the quantum analog register as a quantum analog encoding of the quantum digital information comprises providing the fifth modified state of the quantum analog register as the quantum analog encoding of the quantum digital information.

11. A method for repeating a quantum field signal, the method comprising:
receiving a quantum field signal;
sampling one or more quantum analog signals from the received quantum field signal;
for each sampled quantum analog signal:
encoding the quantum analog signal as corresponding digital quantum information, comprising applying a hybrid analog-digital encoding operation to the quantum analog signal and a qudit in an initial state; and
storing the corresponding digital quantum information in the qudit;
generating a recovered quantum field signal, comprising:
for each qudit storing corresponding digital quantum information, decoding the quantum digital information by applying a hybrid digital-analog decoding operation to the qudit and a quantum analog register in an initial state; and
combining the decoded quantum digital information; and
transmitting the recovered quantum field signal.

12. The method of claim 11, wherein:
the received quantum field signal comprises a Gottesman, Kitaev and Preskill (GKP) state;
the one or more quantum analog signals sampled by the quantum signal converter comprise one or more GKP state samples; and
the recovered quantum field signal comprises a recovered GKP state.

13. The method of claim 11, wherein storing the corresponding digital quantum information further comprises performing one or more rounds of quantum error correction operations on digital quantum information stored in the quantum memory.

14. The method of claim 13, wherein the quantum error correction operations comprise syndrome measurements, classical decoder operations and quantum error correcting feedback operations.

15. The method of claim 13, wherein generating the recovered quantum field signal comprises, for each qudit storing corresponding error corrected digital quantum information, decoding the error corrected quantum digital information by applying a hybrid digital-analog decoding operation to the qudit storing error corrected digital quantum information and a quantum analog register in an initial state.

16. The method of claim 11, wherein the hybrid analog-digital encoding operation and the hybrid digital-analog decoding operation are based on a swap operation comprising three adder operations.

17. The method of claim 16, wherein the swap operation comprises:
- a first adder operation applied to a first signal and a second signal;
- two sequential Fourier transformations applied to the second signal;
- a second adder operation applied to the first signal and the second signal;
- two sequential Fourier transformations applied to the first signal;
- a third adder operation applied to the first signal and the second signal; and
- two sequential Fourier transformations applied to the second signal.

18. The method of claim 11, wherein the hybrid analog-digital encoding operation and the hybrid digital-analog decoding operation comprise:
- a first unitary transformation comprising a canonical field momentum operator and a qudit field operator;
- multiple Fourier transformations; and
- a second unitary transformation comprising a canonical field position operator and the qudit field operator.

19. The method of claim 18, wherein applying the hybrid analog-digital encoding operation to the quantum analog signal and a qudit in an initial state comprises:
- applying the first unitary transformation to the quantum analog signal and the initial state of the qudit to obtain a first modified quantum analog signal and a first evolved state of the qudit;
- sequentially applying two Fourier transformations to the first modified quantum analog signal to obtain a second modified quantum analog signal;
- applying a Fourier transformation to the first evolved state of the qudit to obtain a second evolved state of the qudit;
- applying the second unitary transformation to the second modified quantum analog signal and the second evolved state of the qudit to obtain a third modified quantum analog signal and a third evolved state of the qudit;
- applying a Fourier transformation to the third evolved state of the qudit to obtain a fourth evolved state of the qudit; and
- applying the first unitary transformation to the third modified quantum analog signal and the fourth evolved state of the qudit to obtain a fifth evolved state of the qudit, wherein providing the qudit in the evolved state as a quantum digital encoding of the received quantum analog signal comprises providing the qudit in the fifth evolved state as a quantum digital encoding of the received quantum analog signal.

20. The method of claim 18, wherein applying the hybrid digital-analog decoding operation to the qudit and a quantum analog register in an initial state comprises:
- sequentially applying two Fourier transformations to the quantum analog register in the initial state to obtain a first modified state of the quantum analog register;
- applying a first unitary transformation to the first modified state of the quantum analog register and the qudit to obtain a second modified state of the quantum analog register and a first evolved state of the qudit, wherein the first unitary transformation comprises a canonical field momentum operator and a qudit field operator;
- applying a Fourier transformation to the first evolved state of the qudit to obtain a second evolved state of the qudit;
- applying a second unitary transformation to the second modified state of the quantum analog register and the second evolved state of the qudit to obtain a third modified state of the quantum analog register and a third evolved state of the qudit, wherein the second unitary transformation comprises a canonical field position operator and the qudit field operator;
- applying a Fourier transformation to the third evolved state of the qudit to obtain a fourth evolved state of the qudit;
- sequentially applying two Fourier transformations to the third modified state of the quantum analog register to obtain a fourth modified state of the quantum analog register; and
- applying the first unitary transformation to the fourth modified state of the quantum analog register and the fourth evolved state of the qudit to obtain a fifth modified state of the quantum analog register, wherein providing the modified state of the quantum analog register as a quantum analog encoding of the quantum digital information comprises providing the fifth modified state of the quantum analog register as the quantum analog encoding of the quantum digital information.

* * * * *